(12) United States Patent
Parker

(10) Patent No.: US 6,587,346 B1
(45) Date of Patent: Jul. 1, 2003

(54) COMBINATION ELECTRICAL POWER DISTRIBUTION AND HEAT DISSIPATING DEVICE

(75) Inventor: David Alan Parker, Livonia, MI (US)

(73) Assignee: Visteon Global Technologies, Inc., Dearborn, MI (US)

( * ) Notice: Subject to any disclaimer, the term of this patent is extended or adjusted under 35 U.S.C. 154(b) by 0 days.

(21) Appl. No.: 10/062,144

(22) Filed: Jan. 31, 2002

(51) Int. Cl.[7] ............................................... H05K 7/20
(52) U.S. Cl. ..................... 361/719; 361/704; 361/717; 361/718; 361/720; 165/185; 174/16.3; 174/252
(58) Field of Search ................................ 361/687, 688, 361/702, 703, 704, 707–709, 712–714, 717–720, 760, 767, 770; 257/675, 706, 707, 709, 712; 174/16.3, 252; 165/80.2, 80.3, 185

(56) References Cited

U.S. PATENT DOCUMENTS

| | | | |
|---|---|---|---|
| 3,670,208 A | | 6/1972 | Hovnanian et al. |
| 4,905,123 A | | 2/1990 | Windle et al. |
| 5,153,449 A | | 10/1992 | Crook et al. |
| 5,184,283 A | * | 2/1993 | Hamel ........................ 361/736 |
| 5,311,398 A | | 5/1994 | Schirmer et al. |
| 5,353,194 A | | 10/1994 | Libretti et al. |
| 5,365,403 A | * | 11/1994 | Vinciarelli et al. .......... 361/707 |
| 5,450,284 A | * | 9/1995 | Wekell ........................ 361/710 |
| 5,459,348 A | | 10/1995 | Smith |
| 5,671,122 A | * | 9/1997 | Schoettl et al. .............. 361/715 |
| 5,719,444 A | | 2/1998 | Tilton et al. |
| 5,804,873 A | | 9/1998 | Pelly |
| 6,088,227 A | * | 7/2000 | Bujtas et al. ................ 361/709 |
| 6,166,909 A | * | 12/2000 | Sumida ....................... 361/704 |
| 6,201,701 B1 | * | 3/2001 | Linden et al. ............... 361/720 |
| 6,212,071 B1 | * | 4/2001 | Roessler et al. ............. 361/704 |
| 6,215,681 B1 | * | 4/2001 | Schuurman et al. ......... 363/141 |
| 6,222,732 B1 | * | 4/2001 | Jakob et al. ................. 361/704 |
| 6,257,329 B1 | * | 7/2001 | Balzano ...................... 165/185 |
| 6,377,462 B1 | * | 4/2002 | Hajicek et al. .............. 361/709 |

\* cited by examiner

*Primary Examiner*—Boris Chervinsky
(74) *Attorney, Agent, or Firm*—Brinks Hofer Gilson & Lione

(57) ABSTRACT

In accordance with the teachings of the present invention, the electronic system comprises a housing having a base and a lid. A circuit board is installed on the base of the housing. At least one solder pad is disposed on the circuit board for receiving an electronic component. The solder pad provides both an electrical connection and a mechanical support to the electronic component. The electronic system is also provided with a devise that is capable of distributing power to the electronic component and simultaneously removing heat away from the electronic component. The device is also mounted on the solder pad and positioned adjacent to the electronic component.

24 Claims, 6 Drawing Sheets

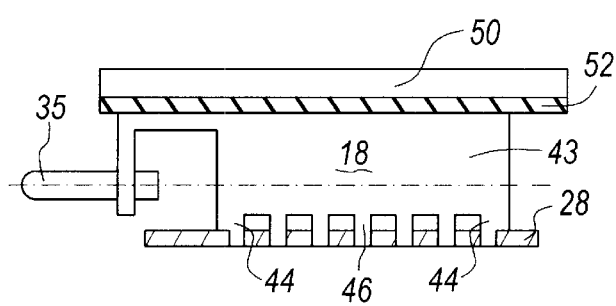
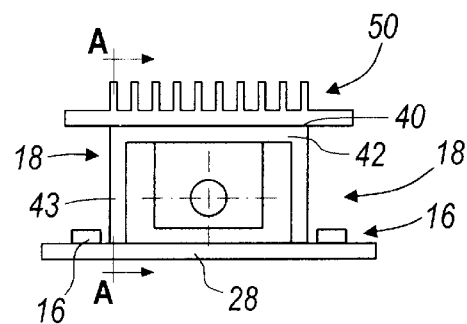
FIGURE - 4B              FIGURE - 4A
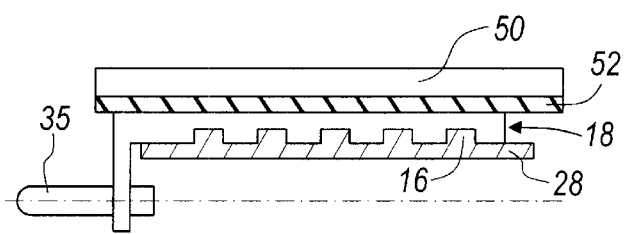
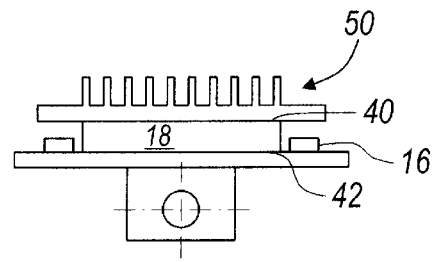
FIGURE - 5B              FIGURE - 5A

COMBINATION ELECTRICAL POWER DISTRIBUTION AND HEAT DISSIPATING DEVICE

TECHNICAL FIELD

This invention generally relates to an electronic system, and more specifically, to a method and devices in electronic system for powering and dissipating heat.

BACKGROUND

Present day advances in the circuit designs have allowed for increased component density in high power distribution systems, more particularly in the application of an automotive distribution box. In such cases it is desirable to have a large number, approximately more than 20, electronic power switching devices mounted on a single circuit board. This requirement of having a large number of electronic power switching devices mounted in a single circuit board poses not only a packaging problem, but also requires effective power distribution and thermal management of the power distribution systems.

Typically, when products use through hole leaded electronic power switching devices, the predominant solution has been to place the electronic power switching devices that stand perpendicular to the circuit board around the perimeter of the circuit board in close proximity to the electronics module case. Electronic power switching devices of this component package type are provided with metal tabs to remove heat from the semiconductor die. These metal tabs are in addition to the plastic case of the device. Additionally, these power switching devices are provided with leads for electrical connection. The electrical connections are exclusively made to the electronic devices through the leads of the devices that are soldered to the circuit board. The leads protrude through holes in the circuit board, therefore; the term through hole leaded device is used. In order to remove the heat generated by the electronic devices, an electrically insulating but thermally conductive material is placed between the power device tab and a heat sink area of the product module case. In order to provide a good thermal conduction, the tabs are securely pressed against the case with the help of spring clips. This method of attaching the electronic device to a circuit board does not utilize the center region of the large circuit board. This application is best suited for a relatively small number of power packages.

In case of products using surface mount devices (SMD), the SMD are frequently placed in the interior of the rectangular circuit board. In cases where the devices operate at a low power, the device does not require additional heat sinking. In many low to mid power cases where additional heat sinking is required an area of the copper is provided on the component side of the circuit board to spread heat from the SMD. In this case the copper area may or may not electrically connect to the circuit board trace sourcing current to the SMD depending on application specific current usage and application specific circuit board layout constraints. Finally, in many mid power applications the copper area under and around the SMD tab includes conductive vias (solder filled plated through holes) to the other side of the circuit board where another copper area provides further thermal conduction and may even be pressed against a silicon pad to a flat plate heat sink on the bottom side of the product case. However, these products are able to provide limited power output which is typically not enough as required in a power distribution system.

Mounting a large number of electronic power switching devices on a single circuit board not only poses a problem of distributing current to the SMDs, but also needs an effective way to remove the heat generated by the SMDs. Only stamped or milled circuit board layers would provide sufficient current conduction for the common drain circuit but that would prohibit routing of the fine pitch control traces to the pins of the SMD devices (and to the gate drives, processor area, input circuitry, etc.). Therefore, an above board electrical bus was required to route power to the devices. At the same time the package would be required to dissipate more heat than in previous applications studied. Therefore, there is a need in the industry to have a device that not only distributes current to the large number of SMDs on the circuit board but also effectively removes the heat generated by the SMDs.

SUMMARY

In an aspect of the present invention, an electronic system having a large number of electronic components that can draw power from a common source and simultaneously dissipate heat to the common source is disclosed.

The electronic system comprises a housing having a base and a lid. A circuit board is installed on the base of the housing. At least one solder pad is disposed on the circuit board for receiving an electronic component. The solder pad provides both an electrical connection and a mechanical support to the electronic component. The electronic system is also provided with a device that is capable of distributing power to the electronic components and also removing heat away from the electronic components. The device is in contact with the solder pad and positioned adjacent to the electronic component.

BRIEF DESCRIPTION OF THE DRAWINGS

Further features and advantages of the invention will become apparent from the following discussion and the accompanying drawings in which:

FIG. 4A is front view of the first embodiment of the device for distributing power and dissipating heat as mounted on the printed circuit board;

FIG. 4B is a cross sectional view through A—A of FIG. 4A;

FIG. 5A is front view of the second embodiment of the device for distributing power and dissipating heat as mounted on the printed circuit board; and FIG. 5B is a side view of the device in FIG. 5A.

DETAILED DESCRIPTION OF THE PREFERRED EMBODIMENT

The following description of the preferred embodiment is merely exemplary in nature and is in no way intended to limit the invention or its application or uses.

Figure 1:
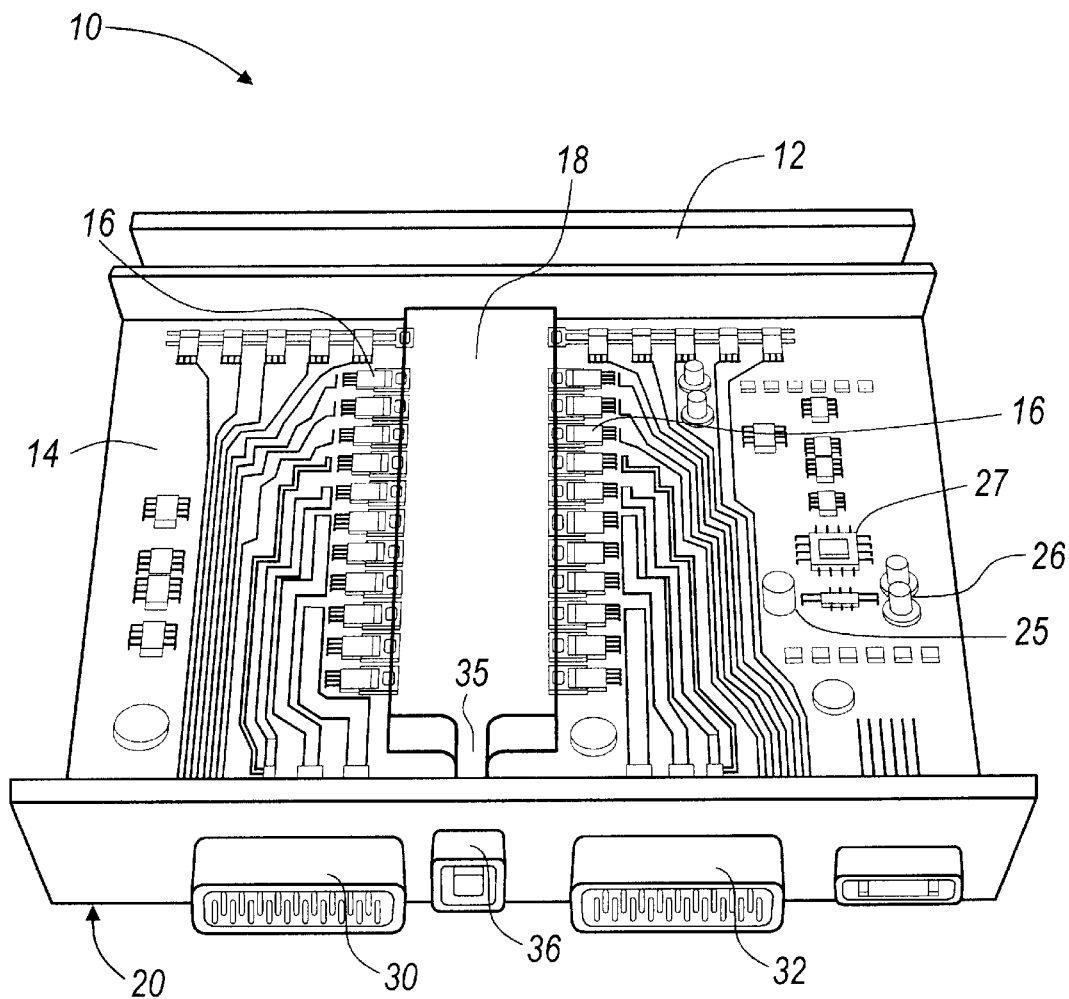
FIG. 1 is a perspective view of the electronic system in accordance with the teachings of the present invention.

Referring in particular to FIG. 1, an electronic system incorporating a power distribution and heat dissipating device, in accordance with the teachings of the present invention is generally shown and designated by reference numeral 10.

Figure 1A:
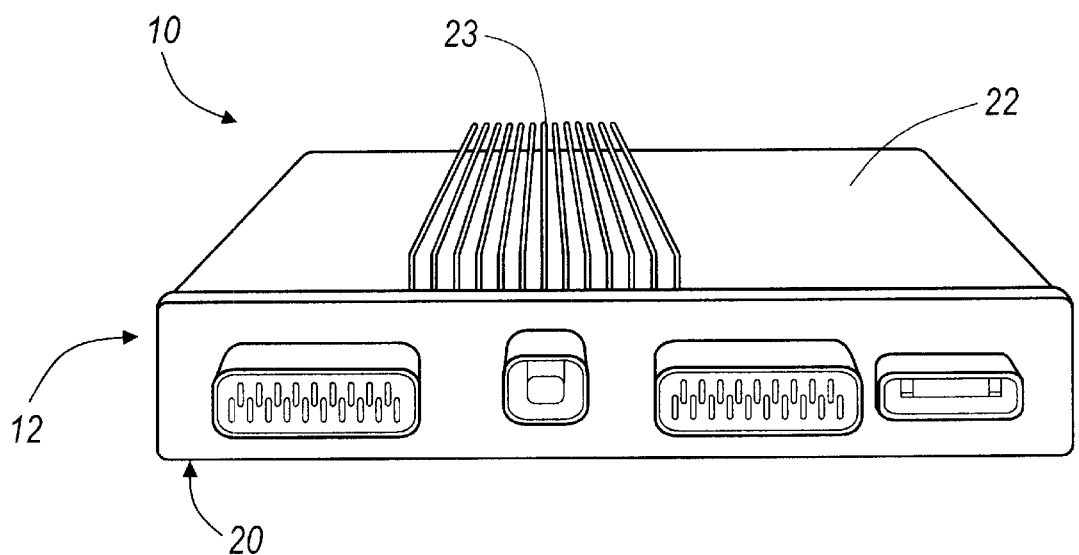
FIG. 1a is a perspective view of the housing having the electronic system with the lid, in accordance with the teachings of the present invention.

As shown, the electronic system 10 comprises a housing 12, a printed circuit board 14, an electronic component 16 mounted on the printed circuit board 14 and a device 18 for distributing power to and dissipating heat from the electronic component 16. The housing 12 defines a base 20 and a lid 22 (shown in FIG 1a). The lid 22 is formed of a metallic material preferably extruded aluminum. The lid 22 also includes external fins 23 extending outward from the housing 12. As will be explained later, the lid 22 of the housing 14 acts as a heat sink to remove heat generated by the electronic component 16. The housing 12 primarily serves to protect the printed circuit board 14 and other components from dust, water and other environmental conditions. The housing 12 is preferably rectangular and is formed of a metallic material such as aluminum or steel. Alternatively, housing 12 may also be formed of a resinous or a polymeric plastic material.

Figure 2:
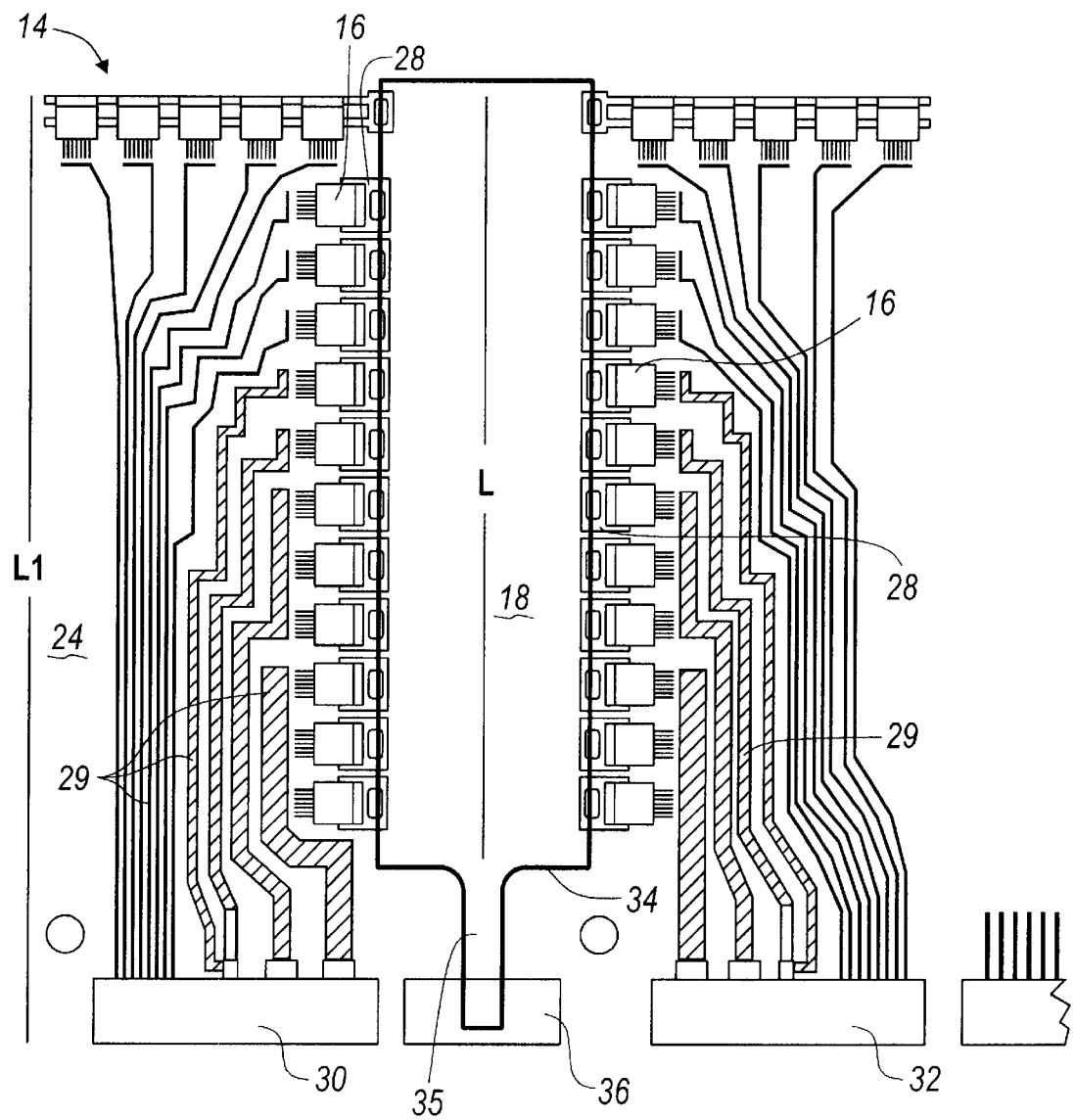
FIG. 2 is a top view of the printed circuit board, in accordance with the teachings of the present invention.

Referring in particular to FIGS. 1 and 2, printed circuit board 14 is installed on the base 20 of the housing 12. The printed circuit board 14 has a first surface 24 or a component surface and a second surface (not shown) opposite the first surface 24. The second surface is attached to the base 20 of the housing with the help of fasteners. Alternatively, other methods of attachment may be used to attach the printed circuit board 14 to the housing 12. Although, in the drawings only a single layer printed circuit board 14 is illustrated, this invention is not limited to a single layer circuit board. The printed circuit board 14 is conventional in the art and is not described in details. The printed circuit board 14 embodies known circuitry to connect the electronic system 10 with other components or to transmit signals to other components to ensure optimal working of any product on which this electronic system 10 is loaded. For example, the electronic system 10 may be loaded on a navigation system for a motor vehicles or in an automobile power distribution system. The printed circuit board 14 also includes other components such as transistors 26, capacitors 25, and a microprocessor 27 mounted on the first surface 24 of the printed circuit board 14. Additionally other components may also be mounted on the first.surface 24 of the printed circuit board 14.

Figure 3:
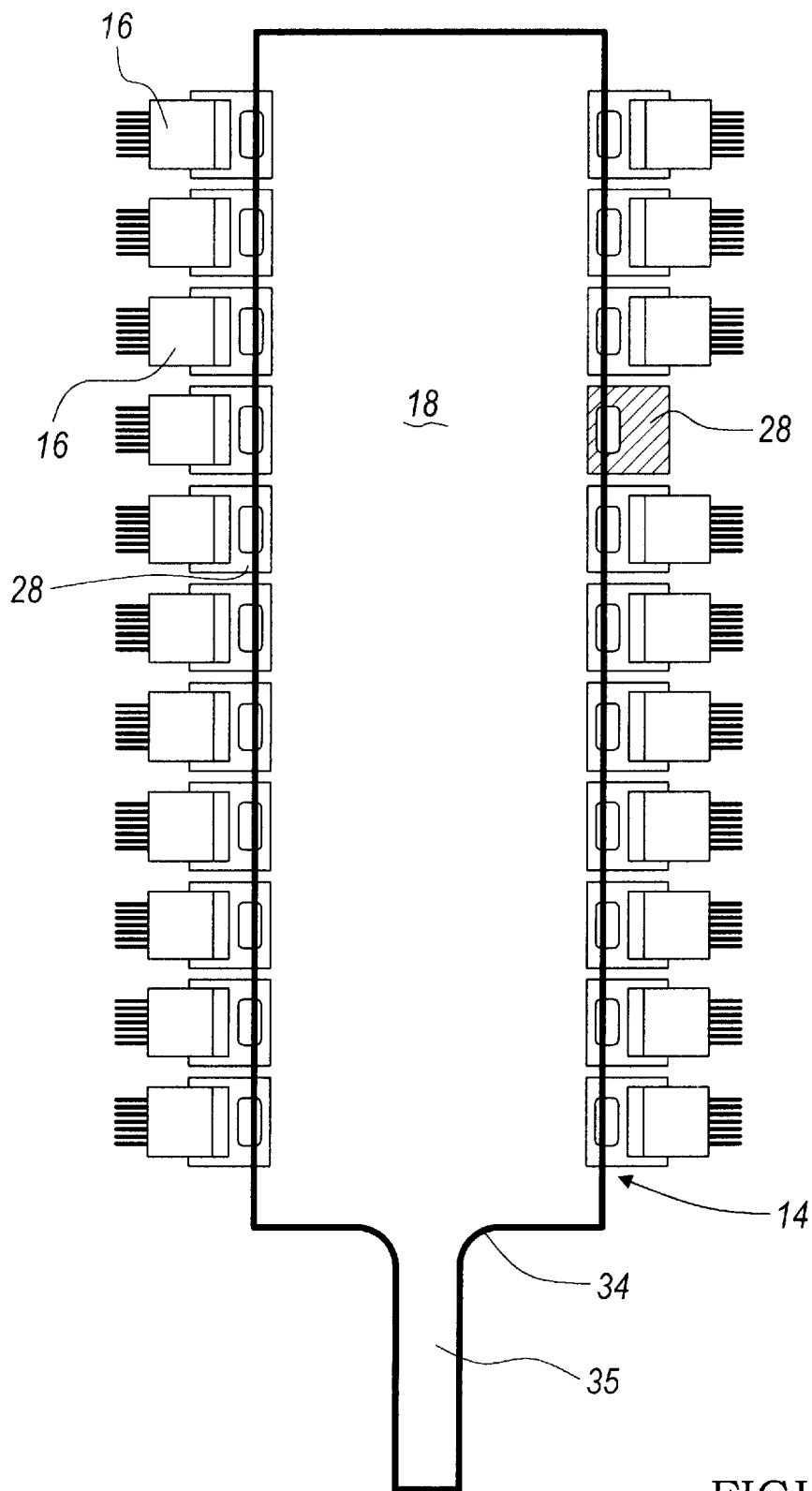
FIG. 3 is a top view of the device for distributing power and dissipating heat, the solder pad and the electronic component in accordance with the teachings of the present invention.

Referring in particular to FIGS. 1, 2 and 3, the first surface 24 of the printed circuit board 14 includes at least one solder pad 28 to receive an electronic component 16 such as a surface mount device (SMD). The electronic component 16 used in this invention is an active device capable of switching power to a load and itself dissipating power in the form of heat. The electronic component 16 may be used in a power distribution box of an automobile where the load current has to be switched. The electronic component 16 is manufactured using known technology and is not explained in details. As shown, a number of individual solder pads 28 are disposed horizontally across the length (L1) of the printed circuit board 14. Preferably, the area of the solder pad 28 is approximately 10 mm×10 mm. Alternatively, the solder pads 28 is in form of a layer on the printed circuit board 14 where the electronic components 16 are individually mounted on the solder pads 28. In addition, it is also possible to dispose the solder pads 28 vertically across the printed circuit board 14. As shown, the solder pads 28 are disposed at the center of the printed circuit board 14 or alternatively, they may be disposed in the periphery of the printed circuit board 14. The solder pads 28 provide both an electrical connection and a mechanical support to the electronic components 16. The solder pads 28 are formed of copper and have a thickness of 2 ounces or more.

As shown in the Figures, the electronic components 16 are mounted on the solder pads 28. Preferably, the electronic component 16 is soldered on to the surface of the solder pads 28. As shown, the electronic system 10 preferably contains a large number of electronic components 16 such that the output from all the electronic components 16 may total approximately 150 amps. As shown, individual electronic components 16 are mounted on individual solder pads 28 disposed on the printed circuit board 14. The electronic components 16 are connected to a plurality of leads or traces 29 on the printed circuit board 14 that carry the power generated by the electronic components 16 to common output connectors 30 and 32. The output connectors 30 and 32 are adaptable of being attached to other components.

In order to supply power to the large number of electronic components 16 mounted on the solder pad 28, a device 18 such as an electrically conductive bus structure is in contact with the solder pads 28. The device 18 also serves to remove the heat generated by the electronic component 16. As shown, the device 18 is a large horizontal thermal mass mounted parallel to the first surface 24 of the printed circuit board 14. Preferably, the length (L) of the device 18 is such that it extends the entire length (L1) of the printed circuit board 14. One end 34 of the device 18 is connected to a common module power pin 35. The common module power pin 35 is connected to an input connector 36 (as shown in FIG. 1) on the housing 12. The input connector 36 is externally connected to a power supply source (not shown). The input connector 36 supplies power to the device 18.

Figure 4C:
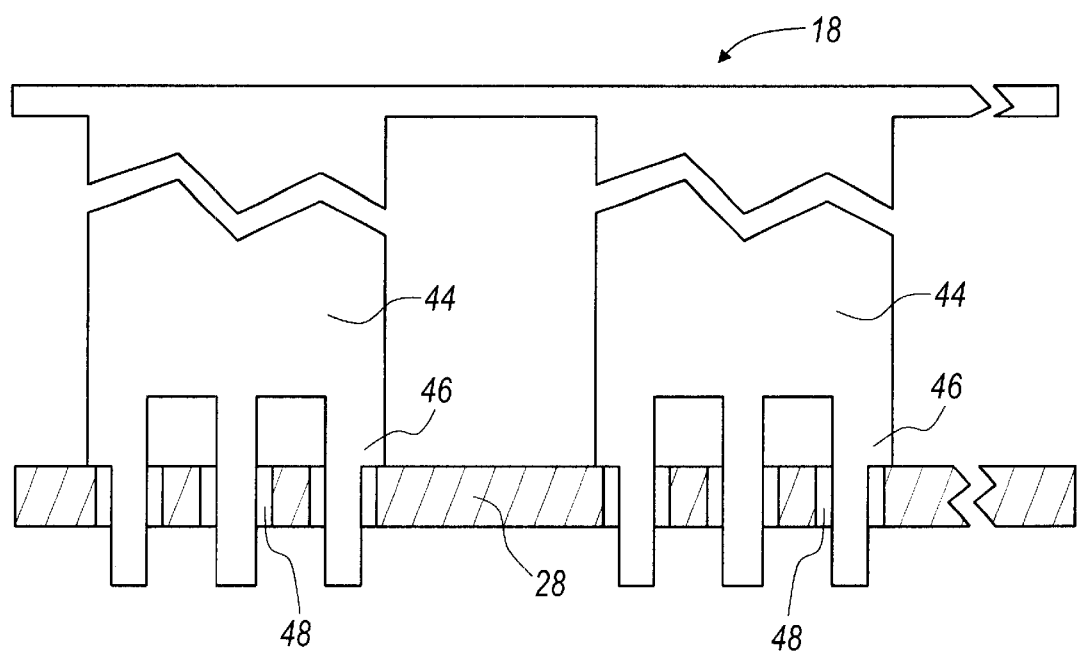
FIG. 4C is a partial view of the device in FIG. 4B showing the pins positioned in the through hole of a printed circuit board.

Referring in particular to FIGS. 4A, 4B, 5A and 5B, the device 18 has an upper surface 40 and a lower surface 42. The lower surface 42 faces the printed circuit board 14 and is in communication with the solder pads 28. Referring in particular to FIGS. 4a, 4b and 4c, the first embodiment of the device 18 is shown As shown in FIG. 4B at least one tab 44 extends vertically from the lower surface 42 towards the solder pads 28. Preferably, the lower surface 42 is provided with a side member 43 and the tab 44 extends vertically from the lower member 43. The tab 44 is positioned between the electronic components 16 such that it is on the solder pad, but adjacent to the electronic components 16. Preferably, the thickness of the tab 44 is in the range of 7 mm to 8 mm. In order to attach the tab 44 to the solder pads 28, each tab 44 includes a plurality of soldering pins 46. In the drawings, although each tab 44 is shown to have 3 soldering pins, more or less than 3 soldering pins may be provided for each tab 44. In order to ensure proper mechanical attachment of the device 18 to the solder pads 28, the solder pads 28 is provided with corresponding through holes 48. The number of through holes 48 provided on the solder pads 28 correspond to the number of soldering pins 46 on each tab 44. The through holes 48 preferably have a circular cross section and are filled with a soldering material such as a tin/lead alloy. Alternatively, the through hole 48 may have a non-circular cross section, The soldering pins 46 are then inserted into the through holes 48 and soldered from the second surface of the printed circuit board 14. This arrangement provides for a reliable and continuous contact between the solder pads 28 and the device 18.

FIGS. 5A and 5B represents a second embodiment of the device 18. In this embodiment the lower surface 42 of the device 18 is directly attached to the solder pads 28. In order to attach the device 18 to the solder pads 28, the solder pads 28 are coated with a layer of the soldering material and the device 18 is allowed to reflow soldered to the solder pads 28.

In both the above embodiments, the contact between the solder pads 28 and the device 18 establishes an electric and a thermal path to distribute power to the electronic component 16 and remove heat away from the electronic component 16. In order to effectively distribute power to the electronic component 16 and remove heat from the electronic component 16, the device 18 is positioned adjacent to the electronic component 16. Preferably, the distance between the device 18 and the electronic component 16 is about 2 mm. The solder pads 28 provides an electrical connection between the device 18 and the electronic component 16 such that the power received by the device 18 is effectively distributed to the electronic component 16. Additionally, the solder pads 28 also serve to provide a mechanical bonding for the device 18 and the electronic component 16. The device 18 is preferably formed of aluminum although other metals such as copper may also be used.

Referring in particular to FIGS. 4A, 4B, 5A and 5B, in order to facilitate the dissipation of the heat generated by the electronic component 16, the upper surface 40 of the device 18 is mated to an electrically isolated heat sink 50. Preferably, the lid 22 of the housing 12 acts as a heat sink 50. In order to electrically isolate the heat sink 50, a thermally conductive silicone pad material 52 is inserted between the top surface 40 of the device 18 and the heat sink 50. As a result, the device 18 has the thermal capacity to draw heat away from the electronic component 16.

As seen from the above, the present invention provides for an electronic system 10 having a device 18 capable of distributing power to a large number of electronic components 16 and at the same drawing heat away from the electronic component 16. The effective working of the device 18 to transfer power to the electronic component 16 depends on the thickness of the solder pad 28, the width of the solder pad 28 and the close proximity of the device 18 to the electronic component 16.

As any person skilled in the art will recognize from the previous description and from the figures and claims, modifications and changes can be made to the preferred embodiment of the invention without departing from the scope of the invention as defined in the following claims.

What is claimed is:

1. An electronic system for processing an electrical signal, the system comprising:
   a housing having a base and a lid;
   a circuit board installed on the base of the housing;
   at least one solder pad disposed on the circuit board;
   at least one electronic component mounted on the at least one solder pad;
   a device in contact with the at least one solder pad and positioned adjacent the at least one electronic component, the device distributes electrical power to the at least one electronic component and dissipates heat generated by the at least one electronic component, wherein the device comprises a first surface and a second surface; and
   at least one finger extending vertically from the first surface of the device towards the at least one solder pad.

2. The system of claim 1, wherein the at least one finger is soldered to the at least one solder pad.

3. The system of claim 1, wherein the at least one solder pad has at least one through hole for receiving the at least one finger.

4. The system of claim 1, wherein the second surface of the device is in communication with the lid of the housing.

5. The system of claim 4, further comprises a thermally conductive pad inserted between the second surface of the device and the lid such that the thermally conductive pad transfers heat from the device to the lid of the housing.

6. The system of claim 5, wherein the thermally conductive pad is made of silicon.

7. The system of claim 1, wherein at least one electronic component is approximately at a distance of 2 mm from the device.

8. The system of claim 1, wherein the area of the at least one solder pad is approximately 10 mm by 10 mm.

9. The system of claim 1, wherein the lid of the housing is an electrically isolated heat sink.

10. The system of claim 1, wherein the lid of the housing further comprises fins extending outwards from the housing to dissipate the heat generated by the at least one electronic component.

11. The system of claim 1, wherein the first surface of the device is parallel to the printed circuit board.

12. The system of claim 1, wherein the first surface communicates with the at least one solder pad to establish an electric and thermal path to the at least one electronic component.

13. A device for distributing power and dissipating heat in an electronic system, wherein the electronic system has a circuit board, a solder pad disposed on the circuit board and at least one electronic component mounted on the solder pad, the device comprising:
   a first surface parallel to the solder pad and the at least one electronic component, wherein the first surface is in communication with the solder pad and positioned adjacent to the at least one electronic component;
   a second surface opposite the first surface; and
   at least one finger extending vertically from the first surface towards the solder pad, wherein the device distributes electricity to the at least one electronic component and simultaneously receives heat from the at least one electronic equipment.

14. The device of claim 1, wherein the at least one finger is soldered to the solder pad.

15. The device of claim 13, wherein the solder pad has at least one through hole for receiving the at least one finger.

16. The device of claim 13, wherein the first surface is directly in contact with the solder pad to establish an electric and thermal path to the at least one electronic component.

17. The device of claim 13, wherein the second surface is in communication with an electrically isolating heat sink.

18. The device of claim 17, wherein the heat sink has fins extending away from the second surface.

19. The device of claim 17, further comprising a thermally conductive pad inserted between the second surface and the heat sink such that thermally conductive pad transfers heat from the device to the heat sink.

20. A method of distributing power and dissipating heat in an electronic system, the method comprising:
   providing a housing having a base and a lid;
   installing a circuit board on the base of the housing;
   disposing at least one solder pad on the circuit board;
   mounting at least one electronic component on the at least one solder pad;
   attaching a device to the at least one solder pad;
   positioning the device adjacent the at least one electronic component;
   wherein the device defines a first surface and a second surface opposite first surface;
   extending at least one finger vertically from the first surface;

defining at least one through hole in the at least one solder pads;

filling the at least one through hole with a soldering material;

inserting the at least one finger into the at least one through hole; and soldering the at least one finger to the at least one solder pad to establish a electric and a thermal path to the at least one electronic component.

21. The method of claim 20, further comprising the steps of:

positioning the first surface parallel to the at least one solder pad and at least one electronic component.

22. The method of claim 20, further comprising:

mounting the first surface of the device to the at least one solder pad;

positioning the first surface adjacent the at least one electronic device;

applying a soldering material on the at least one solder pad; and reflowing the soldering material to attach the first surface of the device to the at least one solder pad to establish an electric and a thermal path to the at least one component.

23. The method of claim 20, further comprising placing the device in communication with the lid of the housing.

24. The method of claim 20, further comprising inserting a thermally conductive pad between the device and the lid, such that the thermally conductive pad transfers heat from the device to the lid of the housing.

* * * * *

UNITED STATES PATENT AND TRADEMARK OFFICE
CERTIFICATE OF CORRECTION

PATENT NO. : 6,587,346 B1 Page 1 of 1
DATED : July 1, 2003
INVENTOR(S) : David Alan Parker It is certified that error appears in the above-identified patent and that said Letters Patent is hereby corrected as shown below:

Column 6,
Line 38, before "wherein" delete "claim 1," and substitute -- claim 13 -- in its place.

Signed and Sealed this

Twenty-fifth Day of November, 2003

JAMES E. ROGAN
*Director of the United States Patent and Trademark Office*